United States Patent [19]
Yazici et al.

[11] Patent Number: 5,726,905
[45] Date of Patent: Mar. 10, 1998

[54] ADAPTIVE, ON LINE, STATISTICAL METHOD AND APPARATUS FOR MOTOR BEARING FAULT DETECTION BY PASSIVE MOTOR CURRENT MONITORING

[75] Inventors: Birsen Yazici, Clifton Park; Gerald Burt Kliman, Niskayuna, both of N.Y.

[73] Assignee: General Electric Company, Schenectady, N.Y.

[21] Appl. No.: 534,530

[22] Filed: Sep. 27, 1995

[51] Int. Cl.⁶ .......................... G01R 23/00; G05B 13/00
[52] U.S. Cl. .................. 364/492; 364/481; 364/483; 364/485; 364/551.01; 364/554; 324/772; 324/545; 324/76.39; 324/76.11
[58] Field of Search ........................... 364/492, 481, 364/550, 551.01, 734, 483, 485; 324/500, 772, 76.39, 545, 554; 382/219, 225, 228, 155; 395/13, 50, 20, 21, 181, 184.01

[56] References Cited

U.S. PATENT DOCUMENTS

| | | | |
|---|---|---|---|
| 4,761,703 | 8/1988 | Kliman et al. | 361/23 |
| 5,570,256 | 10/1996 | Schoen et al. | 361/31 |
| 5,574,387 | 11/1996 | Petsche et al. | 324/772 |
| 5,576,632 | 11/1996 | Petsche et al. | 324/772 |
| 5,578,937 | 11/1996 | Haynes et al. | 324/772 |
| 5,602,761 | 2/1997 | Spoerre et al. | 364/554 |
| 5,629,870 | 5/1997 | Farag et al. | 364/551.01 |

OTHER PUBLICATIONS

"Pattern Recognition and Neural Engineering" by K.Fukunaga, et al, *Neural Networks Concepts, Applications and Implementations*, vol. 1, pp. 10–33.

"Introduction to Statistical Pattern Recognition" by K Fukunaga, 2nd Edition, Computer Science and Scientific Computing, 1990, 1 page.

"Pattern Recognition Principles" by J. Tou, et al, Applied Mathematics and Computation, 1974, pp. 86–87.

"An Unsupervised, On–Line System for Induction Motor Fault Detection Using Stator Current Monitoring" by R. Shoen, et al, IEEE, 1994, pp. 103–109, vol. 1.

*Primary Examiner*—Emanuel T. Voeltz
*Assistant Examiner*—Tuan Q. Dam
*Attorney, Agent, or Firm*—Ann M. Agosti; Marvin Snyder

[57] ABSTRACT

A motor current signal is monitored during a learning stage and divided into a plurality of statistically homogeneous segments representative of good operating modes. A representative parameter and a respective boundary of each segment is estimated. The current signal is monitored during a test stage to obtain test data, and the test data is compared with the representative parameter and the respective boundary of each respective segment to detect the presence of a fault in a motor. Frequencies at which bearing faults are likely to occur in a motor can be estimated, and a weighting function can highlight such frequencies during estimation of the parameter.

16 Claims, 4 Drawing Sheets

ADAPTIVE, ON LINE, STATISTICAL METHOD AND APPARATUS FOR MOTOR BEARING FAULT DETECTION BY PASSIVE MOTOR CURRENT MONITORING

BACKGROUND OF THE INVENTION

Motor current spectrum monitoring can be used to assess changes in motor physical conditions. Because these changes in the current spectrum depend on the load characteristics of the motor and the physical structure of the motor, it is not possible to use a fixed baseline current value (or a corresponding power spectrum) to indicate the presence of motor fault.

A technique for detecting motor bearing faults is discussed in R. R. Schoen et al., "An Unsupervised, On-Line System for Induction Motor Fault Detection Using Stator Current Monitoring," IEEE Conference Record of the 1994 Industry Applications Conference Twenty-Ninth IAS Annual Meeting (2–6 Oct. 1994), pp. 103–09, vol. 1. Schoen et al. describe a system using artificial neural networks, rule-based frequency filters, and a neural network clustering algorithm to learn the spectral characteristics of a good motor and its load operating on-line. Schoen et al. calculate an adaptable frequency table which indicates the number of occurrences and the average magnitude for each accepted frequency component of the spectra and an adaptable threshold value which is a multiple of the average of all the frequency components by a redefined scaling multiplier. Schoen et al. appear to apply stationary spectrum techniques and assume that the spectrum is stable over a relatively long period of time.

SUMMARY OF THE INVENTION

It would be desirable to have a passive, on line fault detection technique that can account for the time-varying nature of faults and can adjust for specific time-varying motor load and physical conditions.

According to the present invention, for a given motor it is assumed that the motor exhibits a sequence of good operating modes corresponding to respective statistically homogeneous time segments representative of respective load patterns and motor conditions. A "good" operating mode includes those modes wherein minor imperfections, such as misalignments, may be occurring but are insufficient to regard as a motor fault. Within each good operating mode, the motor current data is assumed to be stationary so that a fixed calibration can be estimated. In the present invention, the current spectra belonging to substantially similar "segments" representing good operating modes are merged and a statistical representative parameter is extracted from each merged segment. A set of calibrations is developed which can then be used to determine whether a given current spectrum belongs to one of the good operating modes. If a test spectrum falls outside all the modes, it is tagged as a potential fault.

BRIEF DESCRIPTION OF THE DRAWINGS

The novel features of the invention are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

For purposes of illustration, the majority of the specification will relate to the detection of bearing faults. A similar analysis however can be performed with other types of motor faults which induce changes in the current, especially if frequencies at which such other types of faults occur can be estimated.

Figure 1:
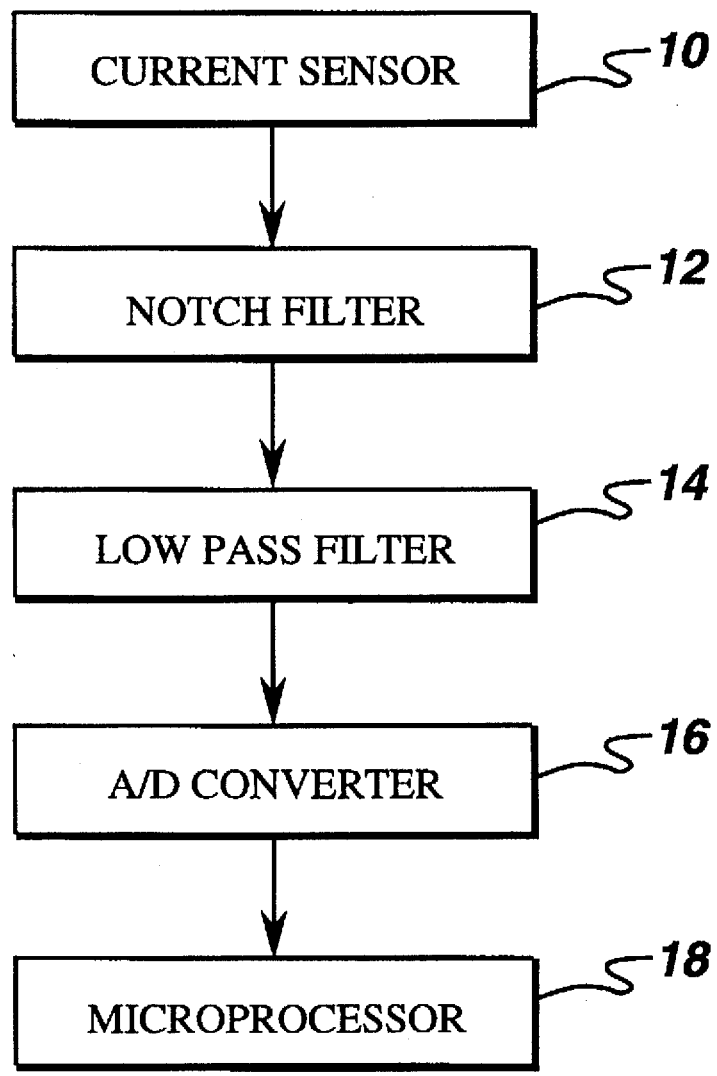
FIG. 1 is a block diagram including fault detection elements used in a preprocessing stage of the present invention.

FIG. 1 is a block diagram including fault detection elements of the present invention. A conventional current sensor 10 can be used to detect motor current data from a motor such as, for example, an induction motor, a DC motor, or a synchronous motor. If an induction motor is used, the motor current data of interest will be stator current, whereas if a DC motor is used, the motor current data of interest will be armature current, for example. Preferably, the motor current data for AC machines is passed through a notch filter 12 to improve the dynamic range of an analog-to-digital (A/D) converter 16. In one embodiment the notch filter comprises a 60 Hz±½ Hz notch filter. After passing through the notch filter, the current data is passed through a low pass filter to prevent aliasing. In one embodiment, the low pass filter 14 is designed to pass current data having frequencies at or below about 0.8 kHz. The filtered current data is then digitized by A/D converter 16 before being transmitted to a microprocessor 18. In one embodiment, A/D converter 16 is a 1.92 kHz sampler.

Figure 2:
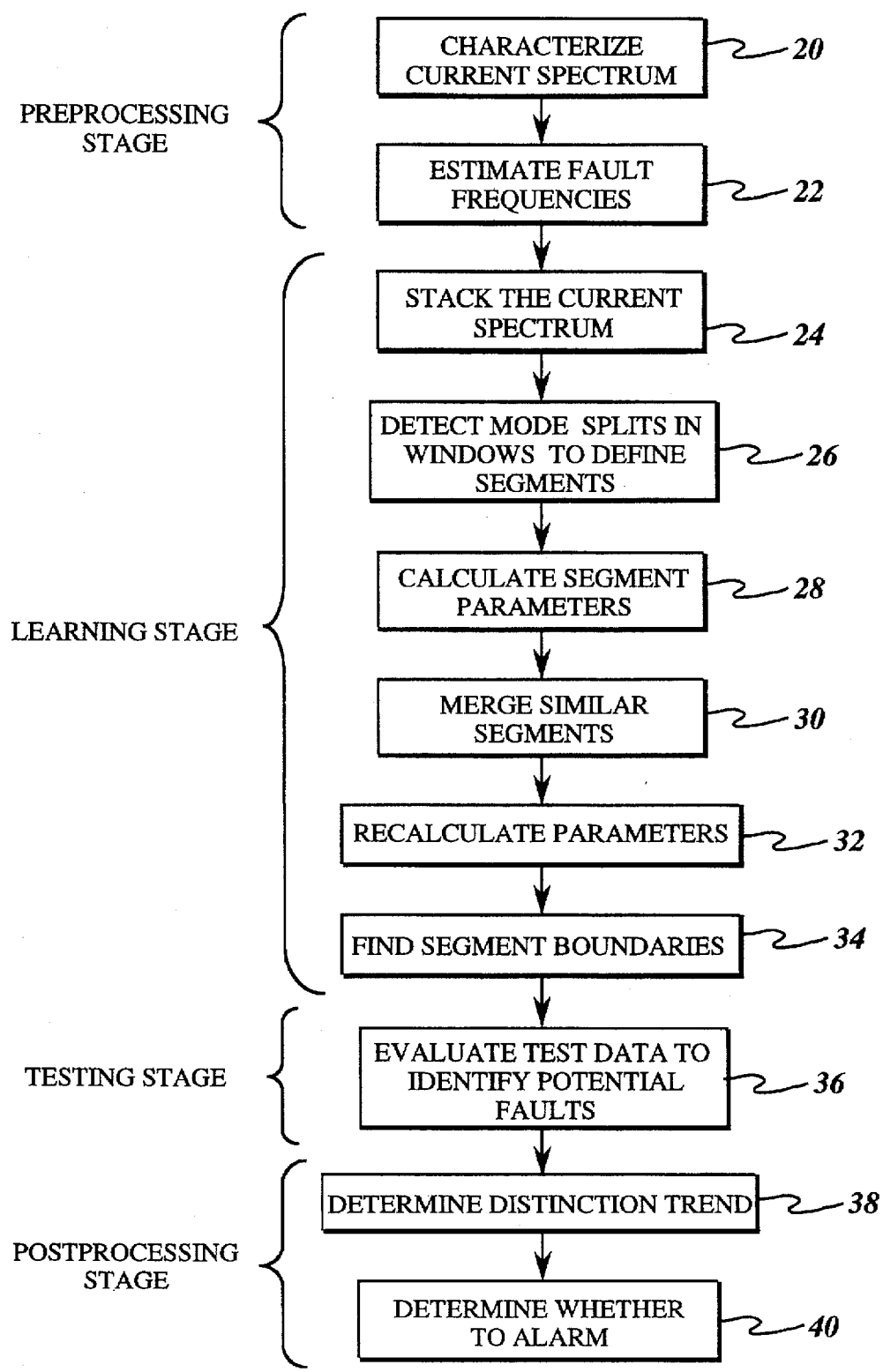
FIG. 2 is a flow chart illustrating a sequence of steps which can be performed to detect motor faults.

FIG. 2 is a flow chart illustrating a sequence of steps of the present invention which can be performed to detect motor faults. In the adaptive method of the present invention, the output current is monitored over a period of time during which the motor is exposed to various good operating modes (as many as possible), and divided into statistically homogeneous segments representing the good operating modes. A set of statistical representative parameters is calculated for each segment and used as a baseline for comparison during a testing stage.

Data acquisition and signal conditioning occur in a preprocessing stage represented by steps 20 and 22. The preprocessing stage is performed for a plurality of load conditions of a particular motor. The more load conditions which are tested, the more complete the analysis (and the more time-consuming and expensive the procedure).

Figure 2A:
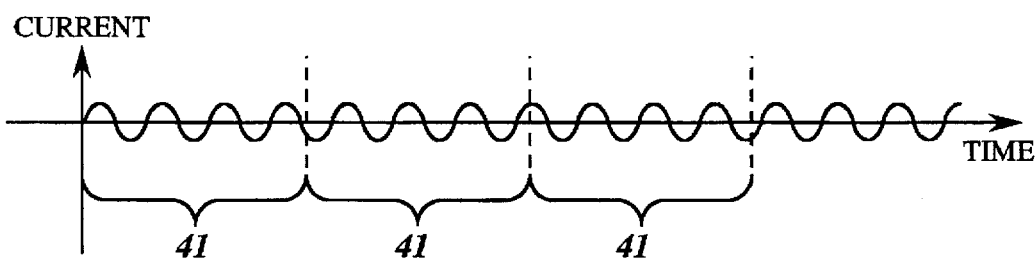
FIG. 2A is an example graph of current data divided into a plurality of portions.

In step 20, motor current data occurring over time is divided into a plurality of portions 41, as shown in FIG. 2A. Preferably the portions are non-overlapping contiguous portions each occupying an equal length of time. Although the portions are shown as including slightly more than three 360 degree periods each, preferably a portion will include a range of approximately 180–200 periods. In one embodiment the portions are spaced in four second intervals. After the current data is divided into a plurality of portions, the current spectrum is obtained within each portion 41 by performing a fast Fourier transform, for example. Preferably the current data is monitored over a sufficient time period for an appropriate number of load conditions to occur.

At step 22, the frequencies at which particular faults are likely to occur are estimated. For ball bearing fault determinations, the frequencies can be calculated using the physical dimensions of the ball bearings, if available. If the dimensions are not available, the frequencies $f_b$ can be estimated, as described in aforementioned Schoen et al., for example, using the textbook equation:

$$f_b = f_s \pm m \times f_v, \quad (1)$$

wherein m is an integer 1, 2, . . . , fs is the supply frequency, and fv is the mechanical vibration frequency (which has a value dependent on the type of ball bearing defect and the dimensions of the bearing).

An estimation of the mechanical vibration frequency fv can be made using the following equations:

$$f_v = 0.6 \times n \times F_{rm}, \text{ for inner race defects and} \quad (2)$$

$$f_v = 0.4 \times n \times F_{rm}, \text{ for outer race defects,} \quad (3)$$

wherein n is an integer 6, 7, . . . , 12, and Frm is the mechanical speed of the motor which is generally available in the nameplate of the motor.

The frequencies at which bearing faults are likely to occur are useful for providing a weighting function when determining a statistical boundary for use in testing the motor, as discussed below.

During a learning stage represented by steps 24–34 the motor current is divided into statistically homogenous segments representative of good operating modes, parameters are extracted for each segment, and a boundary is defined for each segment.

The learning stage operates under several assumptions. One assumption is that each of the load patterns calculated in step 20 reflects a respective good operating mode. Another assumption is that the motor current is stationary for each good operating mode but not across the modes. A third assumption is that the good operating modes change relatively slowly and contiguous current spectrum strips are likely to fall into the same mode. Under these assumptions, in the present invention the mode detection technique can be posed as an image edge detection problem.

Figure 3:
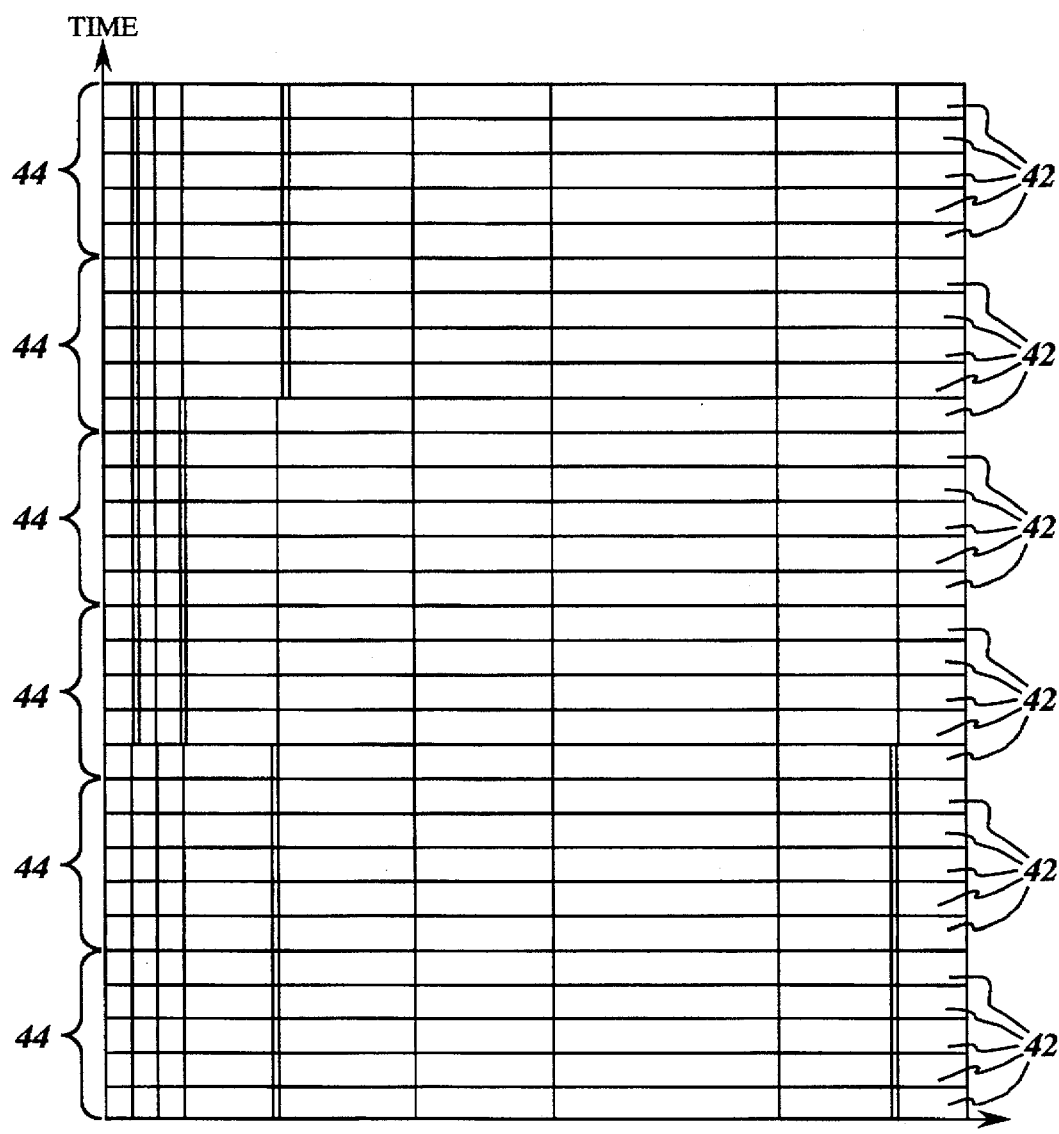
FIG. 3 is an example graph of frequency versus time illustrating a stacking of current spectra.
Figure 4:
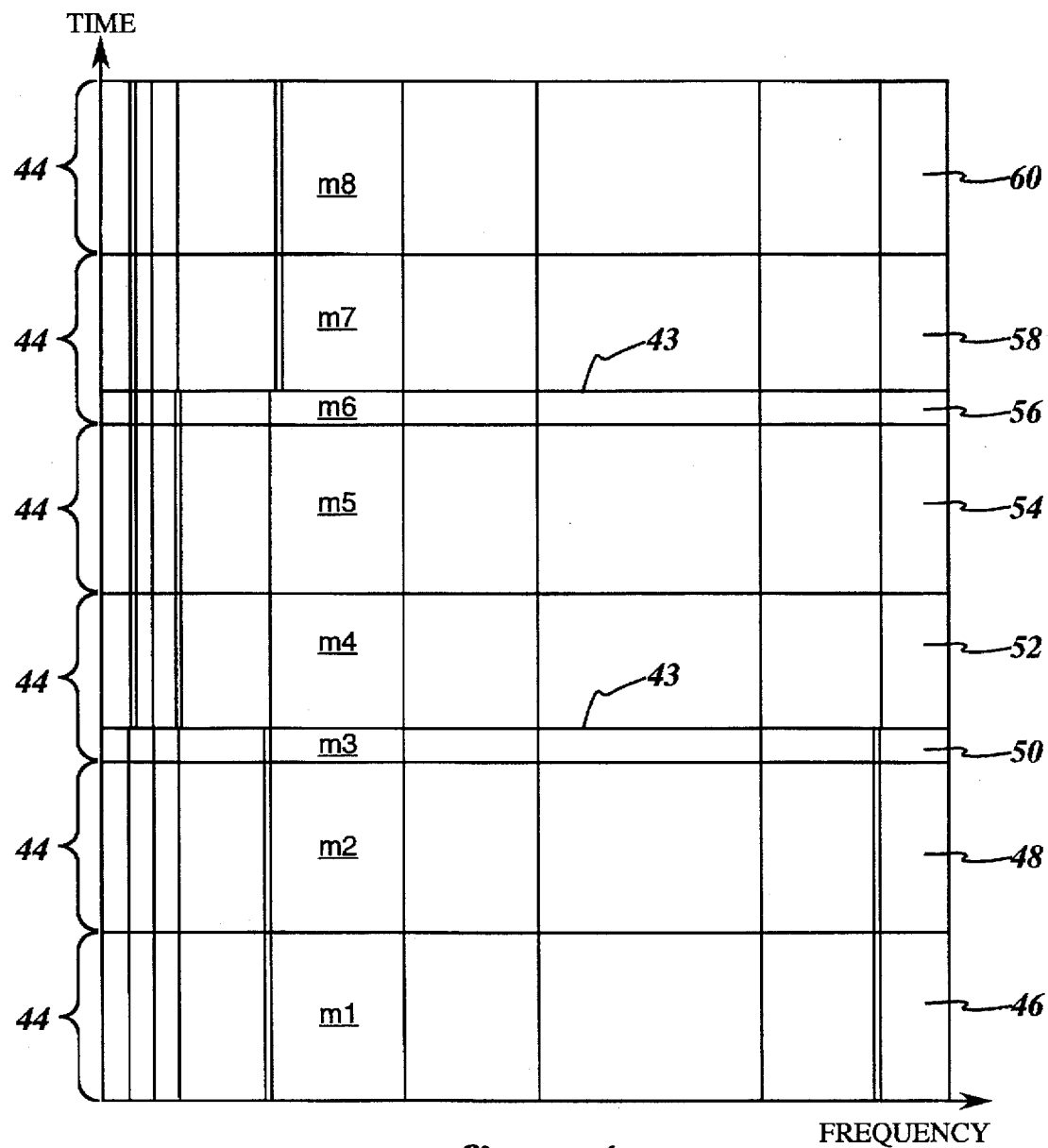
FIG. 4 is an example graph similar to that of FIG. 3 illustrating merged current spectra.

At step 24, the current spectra are stacked as illustrated by FIG. 3 which is an example graph of frequency versus time illustrating a stack including a plurality of strips 42, each of which represents a current spectrum obtained from performing a fast Fourier transform, for example, of the corresponding portion 41 of the current data. The number of strips in a stack is dependent on both the length of time of current monitoring and the sampling frequency. Thirty strips are shown in FIGS. 3 and 4 for illustrative purposes only.

The vertical lines present in strips 42 represent locations where the intensity of the spectra is high. Each mode includes a plurality of respective peak locations and intensities (intensities are not shown).

In one embodiment, for convenience, the stack can be divided into a plurality of windows 44. The number of strips in a window is chosen to be few enough that the motor could exhibit at most two different operating modes within a single window. In the example of FIG. 3, the thirty strips are divided into six windows each having five strips. In one embodiment, the strips overlap such that the first window would have the first 5 strips, the second window would have the 4th through 8th strips, the third window would have the 7th through 11th strips, etc. The advantage of this embodiment is an increased precision.

Within each window a window edge location is estimated at step 26 by maximizing the conditional probability (P) of the data (X) given the location of the edge ($n_o$) representing the position of the specific one of the strips (n) being evaluated. FIG. 4 is a graph similar to that of FIG. 3 illustrating edges 43 of windows 44 after segment edge location determination has occurred in the windows. The edge estimation can be performed by the following calculation which determines at which point ($\hat{n}$) the probability of specific data is maximized:

$$\hat{n} = \text{argmax}_{n_o} P(X|n=n_o), \quad (4)$$

wherein argmax$_{no}$ represents the maximum of the argument (the probability P that X is the data within a given window 44 representative of a plurality of spectral data in the strips (n) and $n_o$ is is the strip candidate for the location of the edge). In one embodiment, under Gaussian assumption equation (4) reduces to evaluating the following criterion function $J_{n_o}$ for each strip:

$$J_{n_o} = \sum_{p=1}^{n_o-1} (X_p - M_{n_o}^1)^T C_{n_o}^{1^{-1}} (X_p - M_{n_o}^1) + \sum_{q=n_o}^{N} (X_q - M_{n_o}^2)^T C_{n_o}^{2^{-1}} (X_q - M_{n_o}^2) \quad (4a)$$

wherein N equals the total number of strips in a given window, T represents transposition of the vector represented by the symbol it is placed on, $X_p$ represents data in the pth strip, $X_q$ represents data in the qth strip, and $n_o$ is the position of the specific strip being evaluated. When $n_o$ is the lowest strip (1) of the window, then the first summation (from p=1 to p=$n_o$−1) does not occur. $M^1_{no}$ and $C^1_{no}$ represent the respective mean and variance of the combination of any strips in the window below the test position $n_o$ (when $n_o$ is 1, there will be no strips below the test position), and $M^2_{no}$ and $C^2_{no}$ represent the respective mean and variance of the combination of any strips in the window including and above the test position. The means and variances can be calculated as discussed below with respect to equations 5 and 6. The edge will then be chosen where $J_{no}$ is maximized. If $J_{no}$ is maximized when $n_o$ is 1, then no edge 43 is present for that window.

After the edge locations are estimated, at step 28 the segment representative parameters are calculated. In one embodiment, the parameters comprise a spectrum mean and variance. Sample mean $M^i_k$ and variance $(\sigma_k^i)^2$ for a given frequency component (entry) k of a segment i of data (representative of a good operating mode) can be estimated using the following formulas:

$$M_k^i = \frac{1}{N_i} \sum_{j=1}^{N_i} X_k^i(j), \text{ and} \quad (5)$$

$$(\sigma_k^i)^2 = \frac{1}{N_i} \sum_{j=1}^{N_i} (X_k^i(j) - M_k^i)^2, \quad (6)$$

wherein Ni the number of strips in segment i, $X^i_k(j)$ is the kth entry of the jth strip of segment i, and $M^i_k$ and $(\sigma_k^i)^2$ are the kth entry of the mean vector $M^i$ and the covariance matrix $V^i$, respectively, for segment i.

After the mean vector and covariance matrix of each segment are determined, at step 30 segments which are substantially similar are identified. One method of determining which segments are substantially similar is to estimate the Bhattacharyya distance B between each of the segments. Using the following formula, the Bhattacharyya distance Bxy between two segments x and y with respective ($M^x, V^x$) and ($M^y, V^y$) parameters, is computed:

$$B_{xy} = \frac{1}{8} (M^x - M^y)^T \left( \frac{V^x + V^y}{2} \right)^{-1} (M^x - M^y) + \frac{1}{2} \ln \left( \frac{det\left(\frac{V^x + V^y}{2}\right)}{\sqrt{det(V^x V^y)}} \right). \quad (7)$$

In one embodiment, the method for using the Bhattacharyya distances to determine whether segments are substantially similar is performed by determining between which two segments the respective Bhattacharyya distance is minimized. The segments having this first minimum Bhattacharyya distance will be merged. The process of determining a minimum Bhattacharyya distance (without including the previously determined minimum distance(s)) repeats in a loop with each pair of segments having a minimum distance being merged until it is determined that such minimum distance equals or exceeds a selected multiple (in one embodiment 3) of the first minimum Bhattacharyya distance.

After similar segments are merged, the representative parameters, i.e., the means and variances, are recalculated at step 32.

At step 34, a statistical segment boundary is defined for each good operating mode. As discussed below, the goal when testing a sample is to determine whether a given test spectrum falls within a boundary of the segments representing good operating modes. To define a boundary, a statistical distance is defined between each member of the segment and the segment parameter. Next, by reviewing the statistics of the distances between the segment members and the segment parameter, a radius for the boundary can be determined for each segment. In one embodiment the distance measure (radius) for each segment is the modified Mahalanobis distance $D_{ij}$:

$$D_{ij} = \sum_{k=1}^{N_k} \frac{(w(k))(X_j^i(k) - M^i(k))^2}{\sigma^{i2}(k)}, \quad (8)$$

wherein $N_k$ represents the number of entries (frequency components) in each strip, $w(k)$ represents a weighting function of the kth entry, $X_j^i(k)$ is the kth entry of the spectrum that belongs to strip j of segment i, $M^i(k)$ represents the mean value for the kth entry of segment i, and $\sigma^{i2}(k)$ represents the variance value for the kth entry of segment i.

The weighting function $w(k)$ is an optional parameter which highlights the bearing frequencies which have been determined to be likely frequencies for faults. Values varying between 1 and 0 can be assigned for each frequency component of the spectrum. Respective weights can be chosen based on physics and/or empirical observations. For example, the simplest method for choosing the weights would be to use a box profile around each relevant frequency point wherein predetermined relevant frequencies have a weight of 1 and all other frequencies have a weight of zero. A more precise method of assigning weights would be to design an appropriately sloped bell curve about each relevant frequency point.

A modified Mahalanobis mean $D_i$ and variance $\rho_i$ of a given segment can be calculated using the expressions:

$$D_i = \frac{1}{N_i} \sum_{j=1}^{N_i} D_{ij}, \text{ and} \quad (9)$$

$$\rho_i = \frac{1}{N_i} \sum_{j=1}^{N_i} (D_{ij} - D_i)^2. \quad (10)$$

In a testing stage represented by step 36 test data is acquired and compared with the parameters of the good operating modes using a statistical measure. A decision based on statistical analysis is made as to whether the test sample is close to one of the good operating calibrations or not. If not, the test sample is tagged as a potentially faulty signal.

In the testing stage, the motor current is again monitored and separated into portions which are each converted to test data by performing a Fourier transform, for example.

A statistical distance between the test data and the parameters of the good operating modes can be determined in the same manner as discussed with respect to the learning stage. The modified Mahalanobis distance $\tau_i$ between a given segment and the test data can be obtained from the following equation:

$$\tau_i = \sum_{k=1}^{N_k} \frac{(w(k))(X^i(k) - M^i(k))^2}{\sigma^2(k)}, \quad (11)$$

wherein $X^i(k)$ is the kth frequency component of the test data.

After the relevant spectral distance (modified Mahalanobis distance in this example) has been estimated, it is determined whether the test data belongs to one of the segments using the equation:

$$\Delta_i = \left| \frac{D_i - \tau_i}{\rho_i} \right|, \quad (12)$$

wherein $\Delta_i$ is a comparison parameter for a segment i which is compared to a corresponding parameter $\alpha_i$. The comparison occurs for each segment i, and it is determined whether for any segment i the corresponding $\Delta_i$ is less than the corresponding $\alpha_i$. In one embodiment, $\alpha_i$ is the higher of (a) 2.5 or (b) the maximum modified Mahalanobis distance of the respective segment i. If there is no segment i for which $\Delta_i$ is less than $\alpha_i$, then the test data represents a potential fault. If there are one or more segments i for which $\Delta_i$ is less than $\alpha_i$, then the test data can be merged into the segment having the smallest $\Delta_i$ value.

In a postprocessing stage represented by steps 38 and 40 the potentially faulty signals are trended over time, and a decision is made whether to indicate an alarm. It is assumed that, if a fault exists, consecutive test data samples will be potential fault signals which will eventually form a segment which is statistically distinct from all the good operating mode segments.

In one embodiment, the distinction between two good operating modes represented by segments a and b is defined by the Bhattacharyya distance $B_{ab}$ as follows:

$$B_{ab} = \frac{1}{8} (M^a - M^b)^T \left( \frac{C^a + C^b}{2} \right)^{-1} (M^a - M^b) + \frac{1}{2} \ln \left( \frac{det\left(\frac{C^a + C^b}{2}\right)}{\sqrt{det(C^a C^b)}} \right), \quad (13)$$

wherein $M^a$ and $M^b$ represent the mean vectors and $C^a$ and $C^b$ represent the covariance matrices over each of the k frequency component entries of segments a and b, respectively.

In this embodiment, the mean and variance of a potential fault segment are calculated in the same manner as discussed above with respect to good operating mode segments (equations 5 and 6). Then the Bhattacharyya distances between the potential fault segment (segment F) and each of the good operating segments are calculated. The shortest of the distances is compared with Bhattacharyya distances between the segment (segment A) having the shortest distance to segment F and the other segments representative of good operating modes. If the Bhattacharyya distance between segment A and segment F is greater or equal to the maximum Bhattacharyya distance between segment A and the rest of the good operating mode segments, then an alarm indication is made. When an alarm indication is made, a motor operator can determine whether to shut down the motor.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An adaptive, on line, statistical method for motor fault detection by passive motor current monitoring comprising the steps of:

sensing a motor current signal during a learning stage;

transforming the motor current signal into a time-frequency spectrum;

dividing the time-frequency spectrum into a plurality of statistically homogeneous segments representative of good operating modes to characterize time variations of the frequency components in the time-frequency spectrum;

estimating a representative statistical parameter of each segment;

determining a respective statistical boundary of each segment;

monitoring the motor current signal during a test stage to obtain test data, the test stage occurring after the learning stage;

comparing the test data with the representative statistical parameter and the respective statistical boundary of each respective segment to detect the presence of a fault in a motor.

2. The method of claim 1, further including, prior to estimating the representative statistical parameter of each segment and determining the respective statistical boundary of each segment, the step of estimating frequencies at which bearing faults are likely to occur in the motor, and wherein the steps of estimating the representative statistical parameter of each segment and determining the respective statistical boundary of each segment include introducing a weighting function to highlight the frequencies at which bearing faults are likely to occur.

3. The method of claim 1, wherein the steps of transforming the motor current signal into a time-frequency spectrum and of dividing the time-frequency spectrum into a plurality of statistically homogeneous segments includes:

dividing the current signal into a plurality of portions each having a specified length of time;

transforming each of the plurality of portions into a respective Fourier spectrum strip; and statistically comparing time-frequency spectra of adjacent ones of the Fourier spectrum strips to determine edge positions for the plurality of statistically homogeneous segments.

4. The method of claim 3, further including, statistically comparing the segments and merging substantially similar ones of the segments.

5. The method of claim 3, wherein the steps of estimating the representative statistical parameter of each segment and determining the respective statistical boundary of each segment include:

calculating a segment mean and a segment variance for each of a plurality of frequency components in each respective segment, the representative statistical parameter comprising the mean;

calculating a modified Mahalanobis distance for each respective strip of each respective segment using the respective segment means and variances; and calculating a modified Mahalanobis mean for each respective segment using the modified Mahalanobis distances, each modified Mahalanobis mean forming a respective radius about a respective segment mean to define the respective statistical boundary.

6. The method of claim 5, further including statistically comparing the segment means and the segment variances and merging similar ones of the segments by calculating a Bhattacharya distance between each segment and the other segments and merging segments having substantially similar Bhattacharya distances.

7. The method of claim 5, wherein the steps of comparing the test data with the representative statistical parameter of each segment and determining the respective statistical boundary of each segment include calculating test modified Mahalanobis distances between the test data and each of the segments, and comparing each test modified Mahalanobis distance with a respective modified Mahalanobis distance mean of a respective segment to determine whether a potential fault exists.

8. The method of claim 7, wherein the segments comprise good segments and further including:

when a potential fault exists, forming a test segment using consecutive test data and determining a test mean and a test variance of each of a plurality of frequency components in the test segment;

calculating good Bhattacharya distances between each good segment and each of the other good segments;

calculating test Bhattacharya distances between the test segment and each of the good segments;

making a determination whether any test Bhattacharya distance between the test segment and a respective good segment is less than any good Bhattacharya distance between the respective good segment and each of the other good segments; and when the determination is negative, indicating an alarm.

9. An adaptive, on line, statistical method for induction motor bearing fault detection by passive stator current monitoring comprising the steps of:

estimating frequencies at which bearing faults are likely to occur in an induction motor;

sensing a stator current signal during a learning stage;

transforming the motor current signal into a time-frequency spectrum:

dividing the time-frequency spectrum into a plurality of statistically homogeneous segments representative of good operating modes to characterize time variations of the frequency components in the time-frequency spectrum;

estimating a representative statistical parameter and a respective statistical boundary of each segment using a weighting function to highlight the estimated frequencies at which bearing faults are likely to occur;

monitoring the stator current signal during a test stage to obtain test data, the test stage occurring after the learning stage;

comparing the test data with the representative statistical parameter and the respective statistical boundary of each respective segment to detect the presence of a fault in the induction motor.

10. The method of claim 9, wherein the steps of transforming the motor current signal into a time-frequency spectrum and of dividing the time-frequency spectrum into a plurality of statistically homogeneous segments includes dividing the current signal into a plurality of portions each having a specified length of time, transforming each of the plurality of portions into a respective Fourier spectrum strip, and statistically comparing time-frequency spectra of adjacent ones of the Fourier spectrum strips to determine edge positions for the plurality of statistically homogeneous segments; and wherein the step of estimating the representative statistical parameter and the respective statistical boundary of each segment includes calculating a segment mean and a segment variance for each of a plurality of frequency components in each respective segment, the representative statistical parameter comprising the mean and variance, calculating a modified Mahalanobis distance for each respective strip of each respective segment using the respective segment means and variances, and calculating a modified Mahalanobis mean for each respective segment using the modified Mahalanobis distances, each modified Mahalanobis mean forming a respective radius about a respective segment mean to define the respective statistical boundary; and wherein the step of comparing the test data with the representative statistical parameter and the respective statistical boundary of each segment includes calculating test modified Mahalanobis distances between the test data and each of the segments, and comparing each test modified Mahalanobis distance with a respective modified Mahalanobis distance mean of a respective segment to determine whether a potential fault exists.

11. A passive motor fault detection apparatus comprising:

a current sensor for monitoring a motor current signal during a learning stage, and for monitoring the motor current signal during a test stage to obtain test data, the test stage occurring after the learning stage;

a computer for, during the learning stage, transforming the motor current signal into a time-frequency spectrum, dividing the time-frequency spectrum into a plurality of statistically homogeneous segments representative of good operating modes to characterize time variations of the frequency components in the time-frequency spectrum, and estimating a representative statistical parameter and a respective statistical boundary of each segment, and, during the test stage, for comparing the test data with the representative statistical parameter and the respective statistical boundary of each respective segment to detect the presence of a fault in a motor.

12. The apparatus of claim 11, wherein the motor is an induction motor, a DC motor, or a synchronous motor.

13. The apparatus of claim 11, wherein means for the computer transforming the motor current signal into a time-frequency spectrum and dividing the time-frequency spectrum into a plurality of statistically homogeneous segments includes:

means for dividing the current signal into a plurality of portions each having a specified length of time;

means for transforming each of the plurality of portions into a respective Fourier spectrum strip; and means for statistically comparing time-frequency spectra of adjacent ones of the Fourier spectrum strips to determine edge positions for the plurality of statistically homogeneous segments.

14. The apparatus of claim 13, wherein the means for the computer dividing the time-frequency spectrum into a plurality of statistically homogeneous segments further includes means for statistically comparing the segments and merging substantially similar ones of the segments.

15. The apparatus of claim 13, wherein means for the computer estimating the representative statistical parameter and the respective statistical boundary of each segment includes means for calculating a segment mean and a segment variance for each of a plurality of frequency components in each respective segment, the representative statistical parameter comprising the mean;

means for calculating a modified Mahalanobis distance for each respective strip of each respective segment using the respective segment means and variances; and means for calculating a modified Mahalanobis mean for each respective segment using the modified Mahalanobis distances, each modified Mahalanobis mean forming a respective radius about a respective segment mean to define the respective statistical boundary.

16. The apparatus of claim 15, wherein the segments comprise good segments, and wherein means for the computer comparing the test data with the representative statistical parameter and the respective statistical boundary of each segment includes means for calculating test modified Mahalanobis distances between the test data and each of the good segments, and comparing each test modified Mahalanobis distance with a respective modified Mahalanobis distance mean of a respective good segment to determine whether a potential fault exists, means for, when a potential fault exists, forming a test segment using consecutive test data and determining a test mean and a test variance of each of a plurality of frequency components in the test segment, means for calculating good Bhattacharya distances between each good segment and each of the other good segments and test Bhattacharya distances between the test segment and each of the good segments, means for making a determination whether any test Bhattacharya distance between the test segment and a respective good segment is less than any good Bhattacharya distance between the respective good segment and each of the other good segments, and means for, when the determination is negative, indicating an alarm.

* * * * *